United States Patent
Takahashi

(10) Patent No.: US 7,579,762 B2
(45) Date of Patent: Aug. 25, 2009

(54) PIEZOELECTRIC VIBRATING PIECE AND PIEZOELECTRIC VIBRATING DEVICE

(75) Inventor: Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 109 days.

(21) Appl. No.: 11/956,254

(22) Filed: Dec. 13, 2007

(65) Prior Publication Data

US 2008/0157630 A1 Jul. 3, 2008

(30) Foreign Application Priority Data

Dec. 28, 2006 (JP) .............................. 2006-354725

(51) Int. Cl.
H01L 41/047 (2006.01)
(52) U.S. Cl. ..................... 310/364; 310/363; 310/346
(58) Field of Classification Search ................. 310/346, 310/363, 364
See application file for complete search history.

(56) References Cited

U.S. PATENT DOCUMENTS

| | | | |
|---|---|---|---|
| 7,327,209 B2* | 2/2008 | Fujii et al. | 333/187 |
| 7,408,428 B2* | 8/2008 | Larson, III | 333/187 |
| 2006/0006965 A1* | 1/2006 | Ishii | 333/191 |
| 2007/0040860 A1* | 2/2007 | Chou et al. | 347/7 |
| 2007/0152775 A1* | 7/2007 | Fujii et al. | 333/133 |

FOREIGN PATENT DOCUMENTS

| | | | |
|---|---|---|---|
| JP | 07-131086 | * | 5/1995 |
| JP | 09-238045 | | 9/1997 |
| JP | 2003-017977 | | 1/2003 |
| JP | 2003-198312 | | 7/2003 |
| JP | 2006-352619 | * | 12/2006 |

* cited by examiner

Primary Examiner—Thomas M Dougherty
(74) Attorney, Agent, or Firm—Woodcock Washburn LLP

(57) ABSTRACT

A piezoelectric vibrating piece having a first and a second surface at an opposing side of the first surface is comprised of an piezoelectric piece having designated coefficient of thermal expansion; a first electrode film having bigger coefficient of thermal expansion than the designated coefficient of thermal expansion and formed on the first surface; and a second electrode film having smaller coefficient of thermal expansion than the designated coefficient of thermal expansion and formed on the second surface.

20 Claims, 5 Drawing Sheets

FIG. 1
(a)
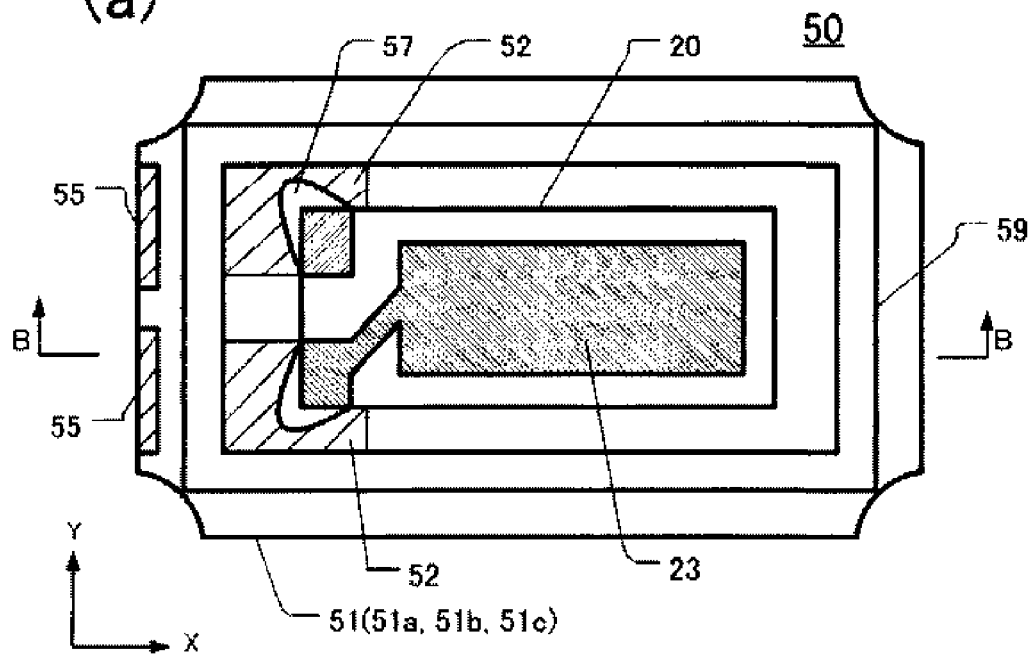
(b)
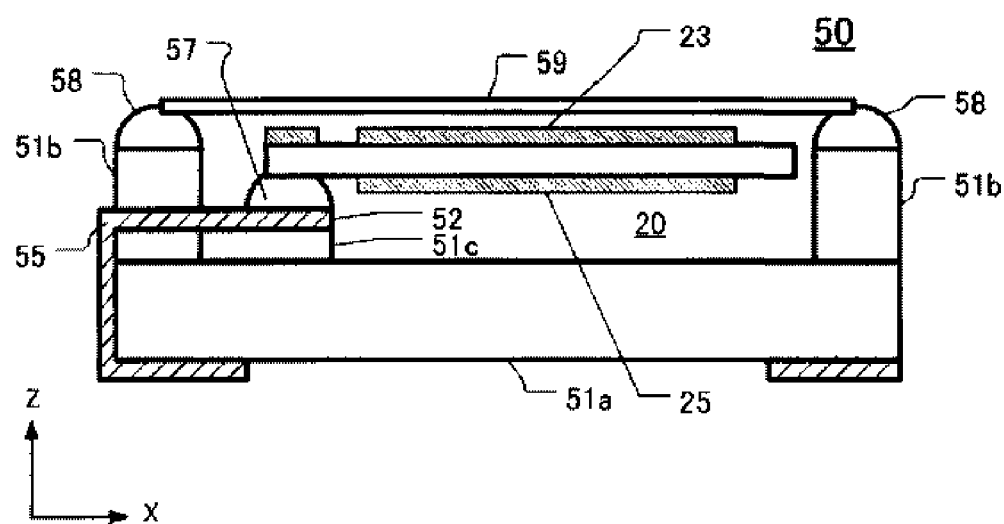

FIG. 5
(a)
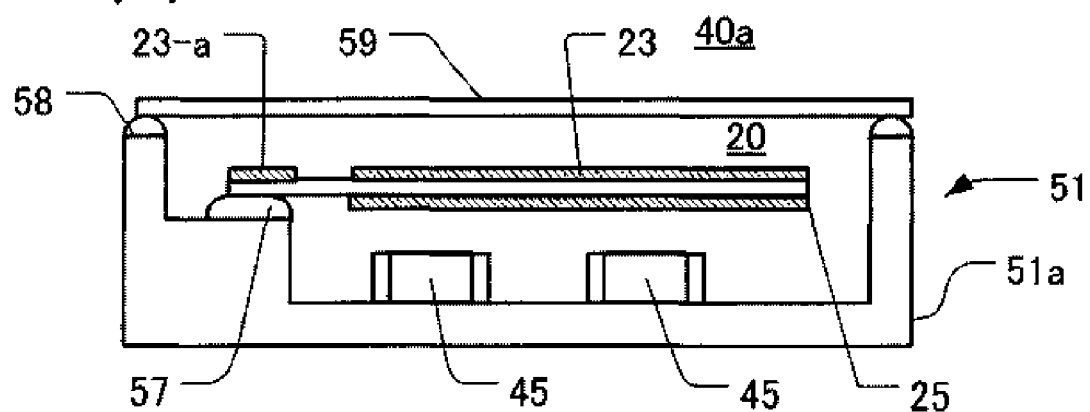
(b)
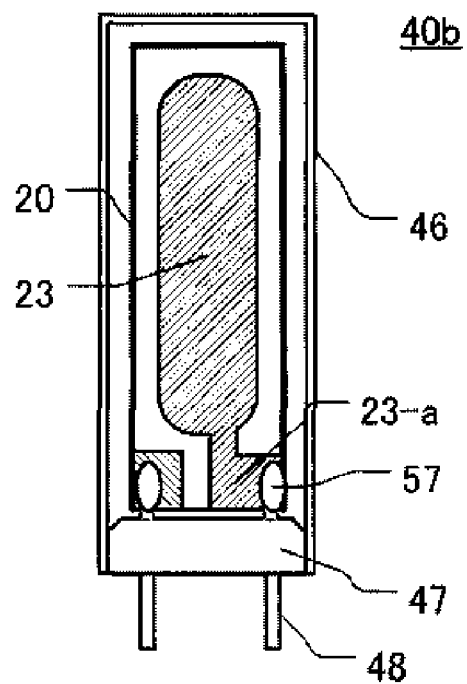

PIEZOELECTRIC VIBRATING PIECE AND PIEZOELECTRIC VIBRATING DEVICE

CROSS-REFERENCE TO RELATED PATENT APPLICATION

This application claims the benefit of Japanese Patent Application No. 2006-354725 filed on Dec. 28, 2006 in the Japan Patent Office, the disclosure of which is incorporated herein in its entirety by reference.

FIELD OF THE INVENTION

This application relates generally to the field of piezoelectric devices.

BACKGROUND OF THE INVENTION

With the miniaturization of various communication devices or electronic devices, piezoelectric vibrating devices such as crystal oscillators or crystal controlled oscillators need to be downsized. A crystal vibrating piece using piezoelectric vibrating devices is attached to a ceramic package by thermosetting resin. On this occasion, the thermosetting resin is heated up either 150° C. or 250° C. to attach the crystal vibrating piece. Therefore, the crystal vibrating piece is heated up either 150° C. or 250° C. as well. Also, when a packaged piezoelectric vibrating device is mounted to an epoxy laminate, the piezoelectric vibrating device is treated with heat by a solder reflow furnace and the crystal vibrating piece in the package is also heated up to 200° C.

After the temperature of piezoelectric vibrating device became 200° C. through the heat treatment, the piezoelectric vibrating device is back to a room temperature. However, sometimes piezoelectric vibrating devices are not back to a designated primary frequency form a varied frequency. In such a case, those products are considered as defective products at the shipment. Supposedly, when such defective products of piezoelectric vibration devices are mounted to the epoxy laminate, they go through a heat treatment such as solder reflow furnace. Inside of the solder reflow furnace is set to 180° C. or 250° C. and after ten seconds, the piezoelectric vibrating device is treated with heat. As described above, after the piezoelectric vibrating device is treated with heat, its frequency is varied as well, even if it is back to a room temperature, and the whole epoxy laminate is considered as defective products. Japanese Unexamined Patent Application Publication No. 2003-17977 disclosed that although such piezoelectric vibrating device considered as a defective product, it is acknowledged that it vibrated proper frequency after few months because remaining stress of crystal vibrating piece was released.

However, if it does not work properly for few months, the product cannot be shipped. Especially, when it is more than 100 MHz, it tends to have a greater frequency change.

Therefore, the purpose of this invention is to provide a piezoelectric vibrating piece and piezoelectric vibrating device having less frequency change for a heat change a heat treatment.

SUMMARY OF THE INVENTION

A piezoelectric vibrating piece of a first aspect having a first and a second surface at an opposing side of the first surface is comprised of an electrode piece having designated coefficient of thermal expansion, a first electrode film having bigger coefficient of thermal expansion than the designated coefficient of thermal expansion and formed on the first surface; and a second electrode film having smaller coefficient of thermal expansion than the designated coefficient of thermal expansion and formed on the second surface. For the vibrating piece, lithium niobate or other piezoelectric single crystal materials besides crystal can be used.

According to the above-mentioned format, on the first surface, it has a first electrode film having a bigger coefficient of thermal expansion than the piezoelectric piece, and on the second surface, a second electrode film having a smaller coefficient of thermal expansion than the piezoelectric piece. The piezoelectric piece is excited by those first and second electrode films. At the condition that the first electrode film is treated with heat, the coefficient of thermal expansion of first electrode film is bigger than of the piezoelectric piece so that it has a factor to drift to the lower frequency. On the other hand, the coefficient of thermal expansion of second electrode film is smaller than of the piezoelectric piece so that it has a factor to drift to the higher frequency. Therefore, even though the piezoelectric piece which is after having a treated with heat, the first electrode film and the second electrode film work to negate frequency changes each other. Thus, the frequency change is smaller after the heat treatment.

The piezoelectric electrode piece of a second aspect is that the first electrode film is formed by a first thickness and the second electrode film is formed by a second thickness which is designated ratio to the first thickness.

To the coefficient of thermal expansion of crystal, the coefficient of thermal expansion of the first electrode film and of the second electrode film are not exactly symmetric. Because of this, in order to negate frequency change, adjust the thickness of electrode films of the first and second electrode films. The thickness of electrode film can be changed properly in the process of making a thin film by sputtering CVD by changing power output or fixing a film forming time.

The piezoelectric vibrating piece of a third aspect is that the first and second electrode films are symmetric shape across a piezoelectric piece and have the same dimensions.

According to the above-mentioned format, the piezoelectric piece is excited by the first and the second electrode films. Because they are symmetric shape and have same dimension across a piezoelectric vibrating device, they can negate the influence of frequency change each other.

The piezoelectric vibrating piece of a forth aspect is the first electrode film is formed in between the electrode piece through a third electrode film.

According to the above-mentioned format, when the first electrode film cannot be deposited, the third electrode film can be formed as a substrate of double layer and the first electrode film can be formed on it.

The piezoelectric vibrating piece of a fifth aspect is that the first electrode film is a gold film and the second electrode film is an aluminum film.

According to the above-mentioned format, by using a high conductive metal film, a fine electric characteristic piezoelectric vibrating piece with small CI value can be obtained.

The piezoelectric vibrating device of other aspects have a package having the piezoelectric vibrating piece of the first or fifth aspect and a cover making a vacuum state and sealing package.

According to the above-mentioned format, by using a productive and high quality piezoelectric vibrating piece, a piezoelectric device can be manufactured.

According to this invention, a piezoelectric vibrating piece and piezoelectric device which has low frequency change to temperature change at a heat treatment can be provided. As a necessary excitation electrode to vibrate, the first and second electrode films are essential, and the electrode films themselves can prevent frequency change at the heat treatment. Therefore, a frequency change can be prevented within a defined value despite of the temperature elevation without increasing of number of parts.

The embodiments of this invention are explained with following figures.

BRIEF DESCRIPTION OF THE DRAWINGS

FIGS. 1(a) and (b) illustrate an embodiment of the piezoelectric vibrating piece 50.

The FIG. 4 is a graph, which has frequency change in vertical scale and time in a horizontal scale, showing a temporal change of frequency change by a heat treatment of the piezoelectric vibrating piece FIG. 5(a) illustrates a crystal oscillator and (b) illustrates a cylinder type oscillator.

DETAILED DESCRIPTION OF ILLUSTRATIVE EMBODIMENTS

Figure 2:
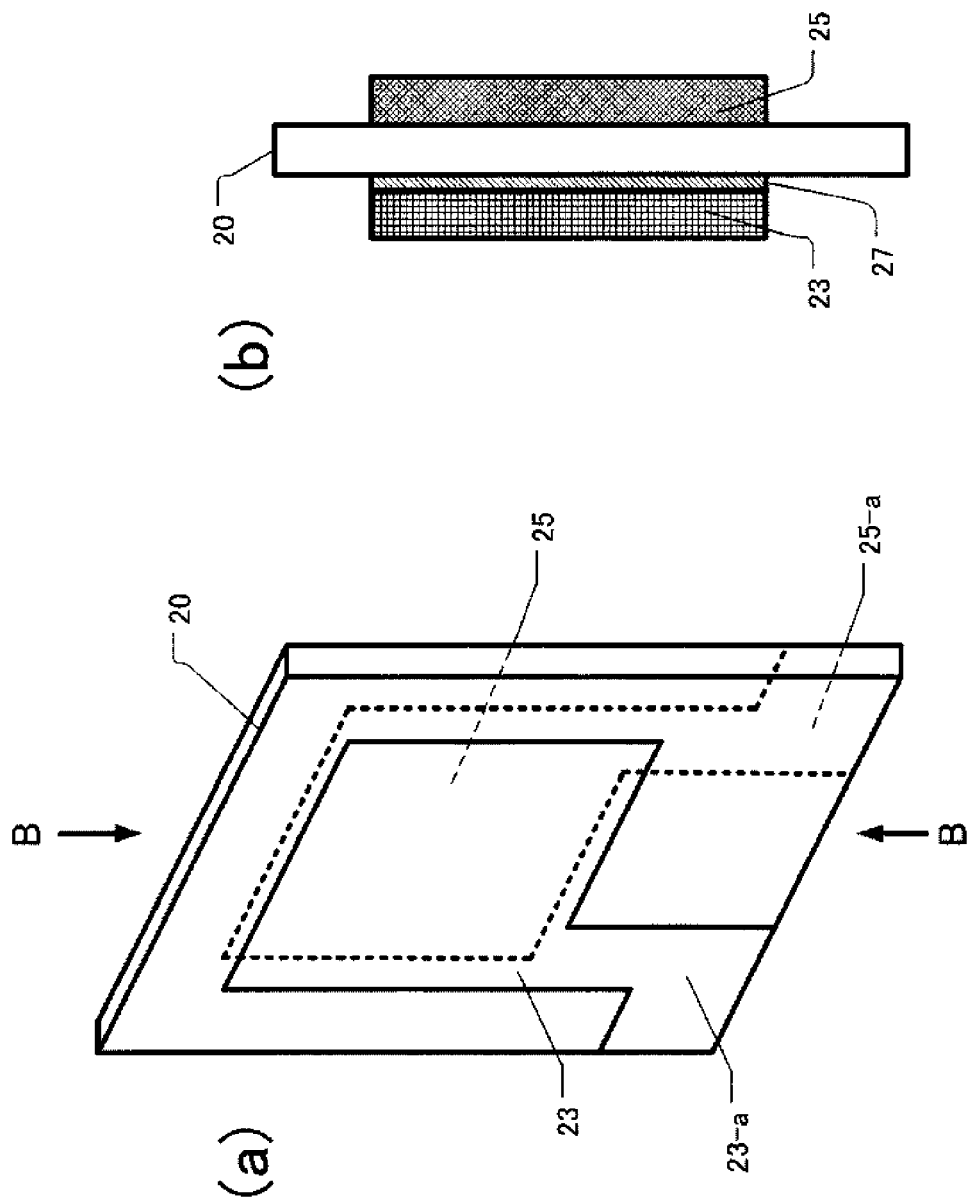
FIG. 2(a) is a perspective view showing a whole format of rectangle-shape piezoelectric vibrating piece 20 and (b) is a cross-sectional view taken form line B-B of the rectangular-shaped piezoelectric vibrating piece 20.

FIG. 1 shows an embodiment of a piezoelectric vibrating device 50 of this invention. FIG. 1(a) is a top schematic view of the piezoelectric vibrating device 50 and FIG. 1(b) is a cross-sectional view taken form line B-B of FIG. 1(a). In FIG. 1, the piezoelectric vibrating device 50 shows an example of a format of a rectangular shaped piezoelectric vibrating piece 20 and the piezoelectric vibrating device 50 stores the piezoelectric vibrating piece 20 in a package 51. The package 51, for example, as an insulting material, is formed and sintered by laminating several ceramic green sheets comprising a kneaded aluminum oxide.

In this embodiment, the package 51 comprises a base 51a, a wall 51b and a floor 51c as shown in FIG. 1(b). An internal space of package 51 is formed by covering with the wall 51b, and the piezoelectric vibrating piece 20 is stored in the internal space. Then, the floor 51c is arranged on the base 51a to support the piezoelectric vibrating piece 20 with a designated height. On the floor 51c, for example, an electrode 52 is formed comprised of a nickel plate or gold plate on tungsten metallization.

An electrode 52 is connected to a mounting terminal 55 formed under the base 51a. Because of this, a driving voltage can be transmitted to the electrode 52 through the mounting terminal 55 and provided to the piezoelectric vibrating piece 20. Specifically, as shown in FIG. 1(b), the mounting terminal 55 and the electrode 52 can be formed by leading the exterior of package 51 with metallization, or by using a conductive through hole formed by tungsten metallization before firing of the base 51a.

An electrically conductive adhesive 57 is coated on the electrode 52 and a base portion 29 of the piezoelectric vibrating piece 20 is connected. As the electrically conductive adhesive 57, for a synthetic resin as an adhesive ingredient exercising a bonding, conductive filler (including conductive particles of fine grain of silver) and designated solvent can be used. In order to solidify the electrically conductive adhesive 57, the whole package 51 is heated in a furnace with a temperature set at approximately 150° C. to 250° C. to heat the electrically conductive adhesive 57.

The upper end of wall 51b is sealed by a cover 59 fixed by a seal 58. The cover 59 is preferably formed by a ceramic comprising kneading material of an aluminum oxide. If it is formed by metal members, such as kovar, the cover 59 is fixed by a method of welding to the wall 51b.

The piezoelectric vibrating piece 20 is, for example, formed with a crystal having a rectangular or round shape. The rectangular shaped piezoelectric vibrating piece 20 shown in FIG. 1 and has a first electrode 23 formed on a first surface with a rectangular shape, and a second electrode 25 formed on a second surface with a rectangular shape.

FIG. 2(a) is a perspective view of the rectangular-shaped piezoelectric vibrating piece 20, and (b) is a cross-sectional view taken form B-B of the rectangular-shaped piezoelectric vibrating piece 20. A base material of the rectangular-shaped piezoelectric vibrating piece 20 is almost quadrate and is formed with AT cut-processed crystal single quartz wafer 10.

Also, the quadrate piezoelectric vibrating piece 20 is, for example, a very small vibrating piece which vibrates at 100 MHz and its size is about 2.0 mm long and 2.0 mm wide. On the surface of the rectangular-shaped piezoelectric vibrating piece 20, a first electrode pattern 23 is formed on a substrate third electrode pattern 27. On the rear surface of the piezoelectric vibrating piece 20, a second electrode pattern 25 is formed. Both the first electrode pattern 23 and the second electrode pattern 25 are formed at the central area of the piezoelectric vibrating piece 20 and have a first extraction electrode 23-a and a second extraction electrode 25-a extracting form the central area to the edge.

The third electrode pattern 27 is a chrome layer of approximately 50 angstrom~300 angstrom. In order to be uninfluential to a thermal expansion of a gold (Au) layer, the third electrode pattern 27 is preferably thinner than the gold layer. The first electrode pattern 23 is, for example, a gold layer of approximately 100 angstrom to 3000 angstrom. The gold layer cannot be evaporated onto a piezoelectric material, such as crystal. For that reason, the chrome layer is formed as a substrate. Total thickness of an electrode pattern of the first electrode pattern 23 and the third electrode pattern 27 is approximately 150 to 3300 angstrom.

On the other hand, the second electrode pattern 25 is, for example, formed with an aluminum (Al) layer of approximately 700 to 21000 angstrom. That is, the ratio of the thickness of the gold layer of the first electrode pattern 23 and the aluminum layer of the second electrode pattern 25 is about 1:7. Also, the first electrode pattern 23 and the second electrode pattern 25 are preferably almost same electrode pattern shape and diameter. The thickness of electrode film can be changed properly in the process of making a thin film by sputtering or CVD by changing power output or fixing a film forming time. There is a device to form the same gold thin film on the both sides of a piezoelectric vibrating piece at once in the sputtering or CVD. If the device forms the metal thin film one by one on each side of the piezoelectric vibrating device, one deposition device forms an aluminum layer and the other device forms the gold layer. Using such a format, the first electrode pattern 23 and the second electrode pattern 25 can work with each other to negate the frequency change.

The heat treatment the piezoelectric vibrating piece 20 receives is a heat treatment which occurs when the piezoelectric vibrating piece 20 is mounted to the package 51 by the electrically conductive adhesive 57, or a heat treatment which occurs when the piezoelectric vibrating device 50 is mounted or reflowed. At such temperature of the heat treatment, the coefficient of thermal expansion of gold is smaller than a single quartz crystal, and of aluminum is bigger than a single quartz crystal. The coefficient of thermal expansion of crystal at 227° C. (550K) is 11.4×10$^{-6}$ for a vertical direction and 19.5×10$^{-6}$ for a parallel direction. Also, the coefficient of thermal expansion of gold is 15.4×10$^{-6}$ and of aluminum is 26.4×10$^{-6}$ at 227° C. (500K).

Instead of a gold layer of the first electrode pattern 23, silver (Ag) can be used. And, the coefficient of thermal expansion of the silver is 19.0×10$^{-6}$ and for a silver layer, it is formed with a silver layer of about 500 to 15000 angstrom. If the ratio of silver layer and aluminum layer is about 5:7, they negate their frequency changes of each other.

Instead of a gold layer of the first electrode pattern 23, a copper (Cu) layer can also be used. The coefficient of thermal expansion of copper is 16.7×10$^{-6}$. The copper layer can be deposited directly to a piezoelectric material such as crystal. In such a case, the third electrode pattern 27 as a substrate is not needed. The copper layer and aluminum layer negate each other's frequency changes when the ratio of thickness is about 7:10.

Also, instead of a chrome layer of the third electrode pattern 27 as a substrate for a gold or silver layer, a tungsten (W) layer, a nickel (Ni) layer, a nickel tungsten layer or a titanium (Ti) layer can be used.

When a crystal single quartz wafer 10 is AT cut, a basic vibrating frequency of the vibrating piece can be shown as about 1670/f (MHz)=t(μm). Therefore, the ratio of the above-mentioned first electrode pattern 23 and the second electrode pattern 25 can be changed with consideration of a ratio of the first electrode pattern 23 and the second electrode pattern 25 properly to desired basic frequency.

Figure 3:
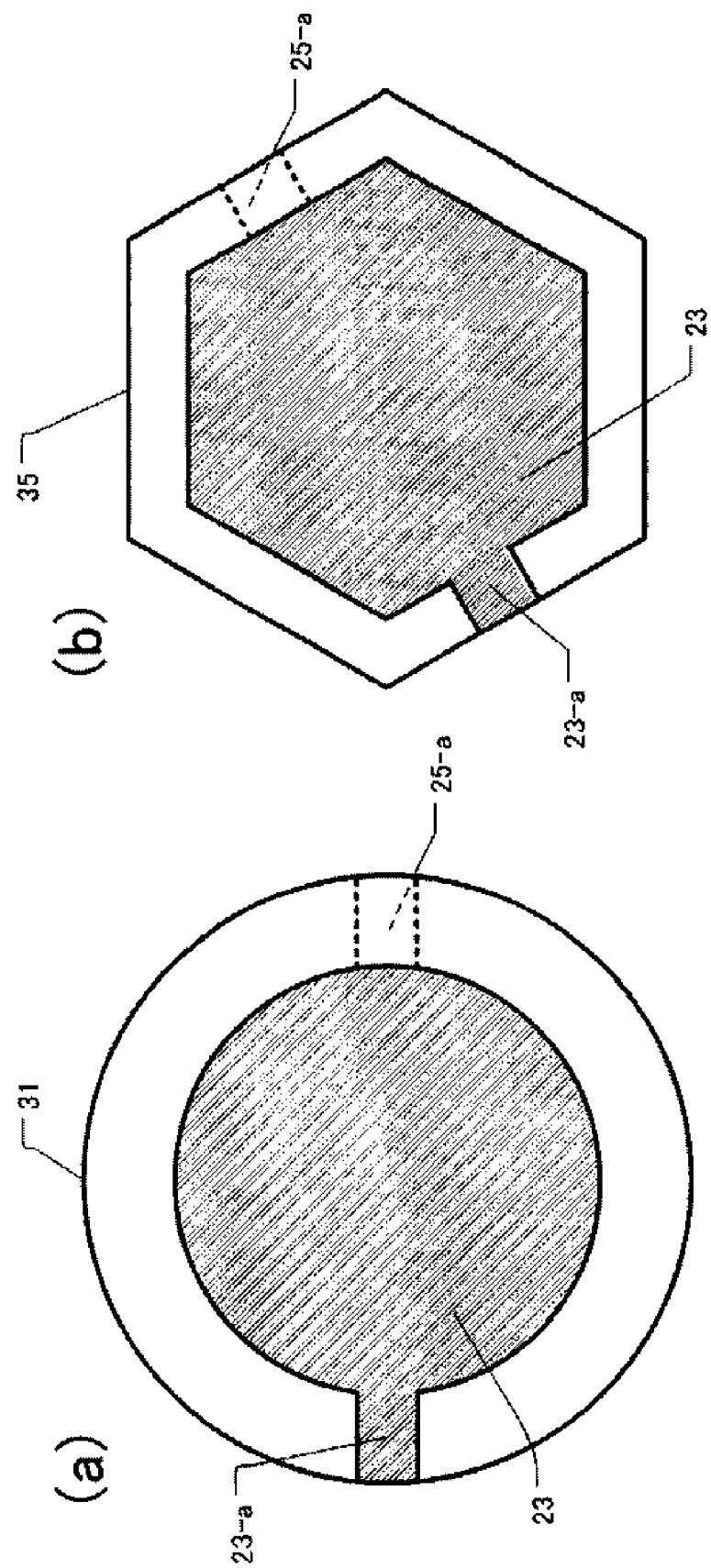
FIG. 3(a) illustrates a piezoelectric vibration piece of a disc geometry and (b) a hexagonal geometry.

FIG. 3 is a plan view of showing other piezoelectric vibrating pieces, and (a) is a piezoelectric vibration piece 31 of disc geometry and (b) is a piezoelectric vibrating piece 35 of hexagonal shape. Both of them have the same shape of electrode pattern and diameter of the first electrode pattern 23 and the second electrode pattern 25. The shape of electrode pattern is not necessarily the same shape of a piezoelectric piece. If forming the first electrode pattern 23 and the second electrode pattern 25 with the above-mentioned condition, the piezoelectric vibration piece 31 of disc geometry or the hexagonal piezoelectric vibration piece 35 which has less frequency change at the temperature change at heat treatment can be manufactured. Therefore, the piezoelectric vibration piece can be any of rectangle, round, or polygonal shape.

Figure 4:
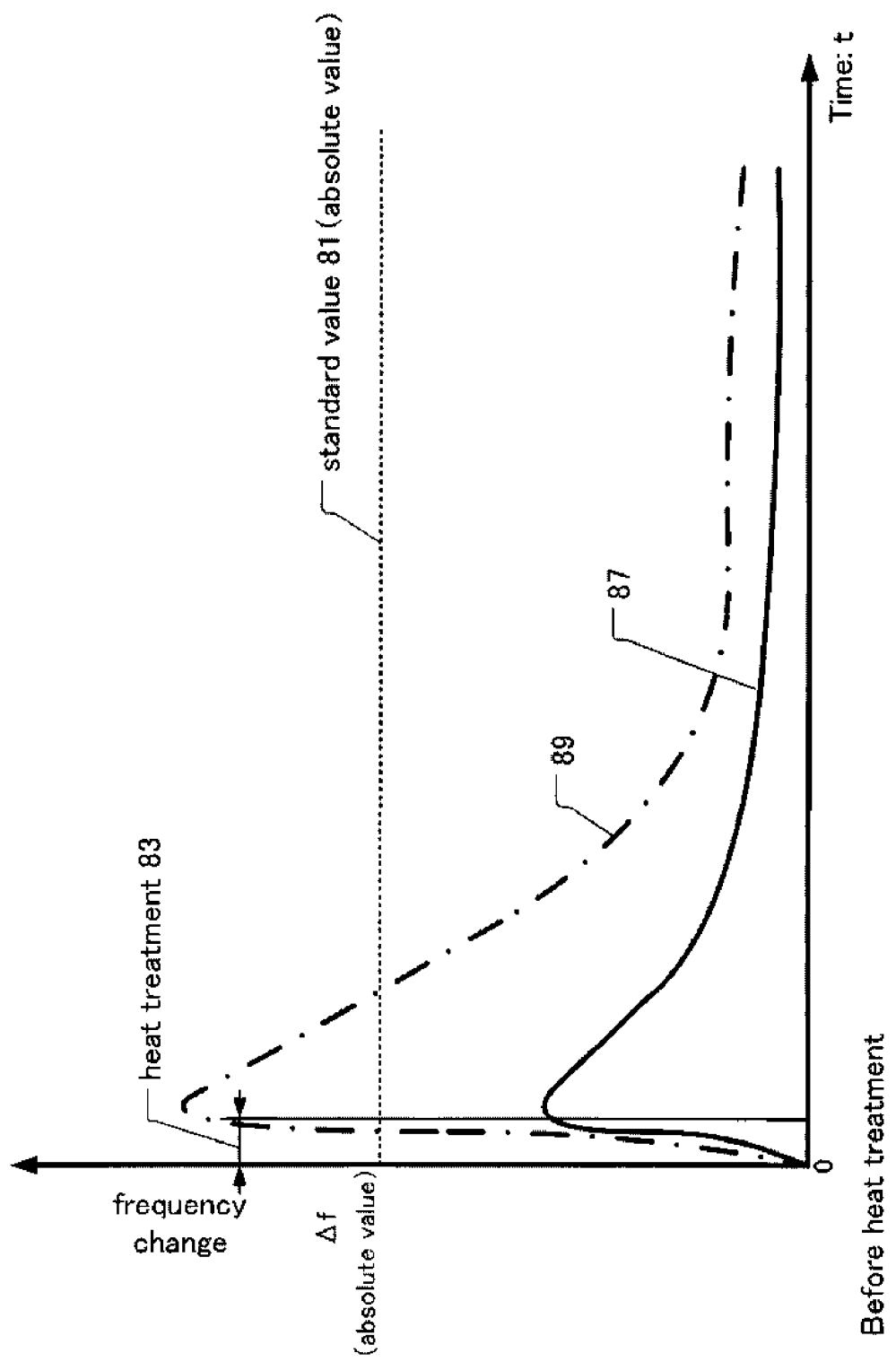

FIG. 4 is a graph having a frequency change in vertical scale and time in a horizontal scale, and shows a temporal change of frequency change by a heat treatment of the piezoelectric vibrating piece. When the piezoelectric vibration pieces 20, 31 and 35 are bonded by the hot cured electrically conductive adhesive 57 to a ceramic package, it is heated up to about 250° C. Also, the piezoelectric vibrating device 50 is also treated with heat of about 250° C. when it is put into the reflow furnace. Even in such environments, a frequency change should be under 81 which is the standard value of piezoelectric vibrating piece 50, which is also called frequency stability, for example, under frequency×10$^{-4}$.

When the piezoelectric vibrating device is processed with a heat treatment 83 in the reflow furnace of about 250° C. within the range that the arrows show in the figure starting untreated, the frequency change of the piezoelectric vibrating device becomes greater. A frequency change 89 of piezoelectric vibrating device of existing product is over the standard value 81 of frequency change, and the value continues to be over after the heat treatment 83. On the other hand, the frequency change 87 of the piezoelectric vibrating device 50 of this embodiment is basically not over the standard value of frequency change 81.

A metal film having a bigger coefficient of thermal expansion than crystal has a factor that decreases the oscillating frequency. A metal film having a smaller coefficient of thermal expansion than crystal has a factor to change oscillating frequency to a higher position. Therefore, although after applying a heat treatment 83, a metal film changing the oscillating frequency to a lower value is formed on one side and a metal film changing the oscillating frequency to a higher value is formed on the rear side, it is considered that the frequency change of the piezoelectric vibrating device 50 is not over the standard value 81. It is also considered that if the piezoelectric vibrating device 50 is back to a room temperature, its frequency returns to a normal resonance frequency.

FIG. 5(a) shows a crystal oscillator 40a. The crystal oscillator 40a has mostly the same format of the piezoelectric vibrating device 50 described with respect to FIG. 1. Therefore, the format and function of the piezoelectric vibrating device 50 and the piezoelectric vibrating piece 20 is omitted by numbering the same numbers to the figures.

The crystal oscillator 40a of FIG. 5(a) has an integrated circuit 45 on the base 51a on the lower side of the piezoelectric vibrating piece 20 of the piezoelectric vibrating device 50 described with respect to FIG. 1. That is, in the crystal oscillator 40a, when the piezoelectric vibrating piece 20 arranged inside vibrates, the vibration is inputted to the integrated circuit 45 and then it will work as an oscillator after designated frequency signal is removed.

FIG. 5(b) is a schematic view of cylinder type oscillator 40b. The above-mentioned piezoelectric vibrating piece 20 is used for this cylinder type oscillator 40b. As the FIG. 5(b) shows, the cylinder type oscillator 40b has a metal cap to store the piezoelectric vibrating piece 20 inside. The cap 46 is pressed to a stem 47 and the inside is kept in a vacuum state. Also, in order to keep the piezoelectric vibrating piece 20 stored in the cap 75, two leads 48 are allocated. The piezoelectric vibrating piece 20 is attached by the electrically conductive adhesive 57 to the leads 48. The piezoelectric vibrating piece 20 is vibrated when it receives a certain current form an electrode.

In the above, crystal vibrating piece is explained as one of examples of a piezoelectric vibrating piece; however, as a piezoelectric vibrating piece, lithium niobate or other piezoelectric single quartz besides crystal can be used.

What is claimed:

1. A piezoelectric vibrating piece having a first surface and a second surface at an opposing side of the first surface comprising:
   a piezoelectric piece having a designated coefficient of thermal expansion;
   a first electrode film having a bigger coefficient of thermal expansion than the designated coefficient of thermal expansion and formed on the first surface; and
   a second electrode film having a smaller coefficient of thermal expansion than the designated coefficient of thermal expansion and formed on the second surface.

2. The piezoelectric vibrating piece according to claim 1, wherein the first electrode film is formed by a first thickness and the second electrode film is formed by a second thickness having a designated ratio to the first thickness.

3. The piezoelectric vibrating piece according to claim 1, wherein the first and second electrode films are symmetric shape across a piezoelectric piece and have the same dimensions.

4. The piezoelectric vibrating piece according to claim 1, where in the first electrode film is formed between the electrode piece through a third electrode film.

5. The piezoelectric vibrating piece according to claim 2, where in the first electrode film is formed between the electrode piece through a third electrode film.

6. The piezoelectric vibrating piece according to claim 3, where in the first electrode film is formed between the electrode piece through a third electrode film.

7. The piezoelectric vibrating piece according to claim 4, wherein the first electrode film is a gold film and the second electrode film is an aluminum film.

8. The piezoelectric vibrating piece according to claim 4 wherein the first electro film comprises copper.

9. The piezoelectric vibrating piece according to claim 5, wherein the first electrode film is a gold film and the second electrode film is an aluminum film.

10. The piezoelectric vibrating piece according to claim 6, wherein the first electrode film is a gold film and the second electrode film is an aluminum film.

11. The piezoelectric vibrating piece according to claim 5, wherein the third electrode film comprises one of: a tungsten (W) layer, a nickel (Ni) layer, a nickel tungsten layer or a titanium (Ti) layer.

12. The piezoelectric vibrating piece according to claim 2, wherein the first and second electrode films are symmetric shape across a piezoelectric piece and have the same dimensions.

13. The piezoelectric vibrating piece according to claim 12, where in the first electrode film is formed between the electrode piece through a third electrode film.

14. The piezoelectric vibrating piece according to claim 13, wherein the first electrode film is a gold film and the second electrode film is an aluminum film.

15. The piezoelectric vibrating piece according to claim 13 wherein the first electro film comprises copper.

16. The piezoelectric vibrating piece according to claim 13, wherein the third electrode film comprises one of: a tungsten (W) layer, a nickel (Ni) layer, a nickel tungsten layer or a titanium (Ti) layer.

17. A package comprising:
a piezoelectric vibrating piece having a first surface and a second surface at an opposing side of the first surface, said piezoelectric vibrating piece having a designated coefficient of thermal expansion;
a first electrode film having a bigger coefficient of thermal expansion than the designated coefficient of thermal expansion and formed on the first surface;
a second electrode film having a smaller coefficient of thermal expansion than the designated coefficient of thermal expansion and formed on the second surface; and
a cover sealing the piezoelectric vibrating piece within the package and capable of sustaining a vacuum state within the package.

18. The package as recited in claim 17, wherein the first electrode film is formed by a first thickness and the second electrode film is formed by a second thickness having a designated ratio to the first thickness.

19. The package as recited in claim 17, wherein the first and second electrode films are symmetric shape across a piezoelectric piece and have the same dimensions.

20. The package as recited in claim 17, where in the first electrode film is formed between the electrode piece through a third electrode film.

* * * * *